United States Patent
Ng et al.

(10) Patent No.: US 7,144,749 B2
(45) Date of Patent: Dec. 5, 2006

(54) METHOD OF ETCHING A SEMICONDUCTOR DEVICE

(75) Inventors: Khim Hong Ng, Singapore (SG); Chin Ling Pong, Singapore (SG)

(73) Assignee: Systems on Silicon Manufacturing Company Pte. Ltd., Singapore (SG)

( * ) Notice: Subject to any disclaimer, the term of this patent is extended or adjusted under 35 U.S.C. 154(b) by 82 days.

(21) Appl. No.: 10/510,640
(22) PCT Filed: Dec. 23, 2003
(86) PCT No.: PCT/SG03/00290

§ 371 (c)(1),
(2), (4) Date: Dec. 2, 2004

(87) PCT Pub. No.: WO2005/062363
PCT Pub. Date: Jul. 7, 2005

(65) Prior Publication Data
US 2005/0233515 A1 Oct. 20, 2005

(51) Int. Cl.
*H01L 21/00* (2006.01)

(52) U.S. Cl. .................................. 438/48; 438/690
(58) Field of Classification Search ............... 438/48, 438/690, 723, 738, 740, 743
See application file for complete search history.

(56) References Cited

U.S. PATENT DOCUMENTS

| | | | |
|---|---|---|---|
| 6,004,881 A | | 12/1999 | Bozada et al. |
| 6,174,753 B1 * | | 1/2001 | Liao .......................... 438/132 |
| 6,194,318 B1 * | | 2/2001 | Ikeda ......................... 438/699 |
| 6,300,252 B1 * | | 10/2001 | Ying et al. .................. 438/723 |

* cited by examiner

*Primary Examiner*—Phuc T. Dang
(74) *Attorney, Agent, or Firm*—Rothwell, Figg, Ernst & Manbeck

(57) ABSTRACT

A method for etching windows 40 in a semiconductor device 10 having a metal fuse 14 embedded therein is disclosed. The method is for allowing accurate fuse blowing, in particular laser fuse blowing. The method involves the controlled removal of layers having different phase diffraction characteristics. After treatment, the remaining area between the metal fuse 14 and the etched surface of the semiconductor has substantially uniform phase diffraction characteristics.

14 Claims, 6 Drawing Sheets

METHOD OF ETCHING A SEMICONDUCTOR DEVICE

CROSS REFERENCE TO RELATED APPLICATION

This application is a 35 U.S.C. § 371 National Phase Entry Application from PCT/SG2003/000290, filed Dec. 23, 2003, and designating the U.S.

FIELD OF THE INVENTION

The invention generally relates to etching of semiconductor devices, and more particularly, to etching of semiconductor devices having metal fuses.

BACKGROUND

Semiconductor devices typically have a circuit design that is repeated or duplicated within the semiconductor. Such repetition or duplication of circuitry design is provided to serve as a back up, should there be a fault or failure in one of the elements. This redundancy is included to improve the success yield rate of the manufactured semiconductor devices. Should one of the circuit elements within the semiconductor device fail, redundancy of the circuitry allows the circuit design to be changed after the processing of the semiconductor device.

One of two different ways is typically used to change the circuit design after the processing of the semiconductor devices has been completed. One of the two ways to change the circuit design is by wire bonding of the semiconductor device during assembly and packaging. The other of the two ways uses metal fuses in one of the metal interconnect layers of the semiconductor device during the processing of the semiconductor device.

In metal fuse redundancy, to deactivate or activate the desired circuitry of the semiconductor device, a selected metal fuse is deliberately damaged by the heat generated from a laser. When the heat generated by the laser reaches a certain threshold, the metal fuse is blown. Such metal fuses that are blown by a laser are typically called laser fuses. One advantage of using laser fuses is the blowing of a particular metal fuse is an automated process, which reduces the likelihood of errors. The automated process involves programming the laser device using information recovered from wafer sort, i.e. the electrical testing of the semiconductor devices after full processing of the wafers. Another advantage is that metal fuses provide increased versatility for the chip designer to provide various levels of redundancy into the semiconductor device chip design.

To obtain accurate laser fuse blowing, it is critical that the amount of diffraction be limited. Diffraction may be due to interference and phase diffraction between the laser light and the dielectric properties of layers of the semiconductor device such as oxide, dope oxide, or the like. The thickness of the inter-metal dielectrics that the laser must pass through must therefore be well controlled. The thickness of the semiconductor device surrounding the metal fuse must be within a strict range. The range depends upon the materials of the dielectrics surrounding the metal fuse of the semiconductor device. The conventional method is to have a fixed thickness of the dielectric above the metal fuse. The thickness of the dielectric depends on the laser wavelength that is used to blow the fuse and, as this differs from fabrication plant to fabrication plant, so the fixed thickness also varies between such plants. It is important is to control the final thickness of the material surrounding the fuse within a certain tolerance. There is thus a need for a method that provides specific control and accuracy of the thickness of the material of the semiconductor device surrounding the fuse of the semiconductor device.

SUMMARY

According to an aspect of the present invention, there is provided a method of etching a semiconductor device having a fuse embedded therein beneath different first and second sets of material, comprising:
(a) first etching at least a first set of material from a first region of the semiconductor device, from the surface of the first set of material in towards the embedded fuse;
(b) measuring the remaining distance between the embedded fuse and the first etched surface of the first region of the semiconductor device;
(c) second etching an amount of the second set of material from said first region of the semiconductor device, from the first etched surface of the first region further in towards the embedded fuse, the amount of the second set of material being determined based on the preceding measurement of the remaining distance;
(d) measuring the remaining distance between the embedded fuse and the second etched surface of the first region of the semiconductor device; and
(e) determining if the remaining distance measured in step (d) falls within a desired range of distances and, if the remaining distance does not fall within the desired range, returning to step (c).

The use of the above aspect allows accurate fuse blowing, in particular laser fuse blowing. The method with the exemplified embodiment involves the controlled removal of layers having different phase diffraction characteristics. After treatment, the remaining area between the metal fuse and a surface of the semiconductor has substantially uniform phase diffraction characteristic.

BRIEF DESCRIPTION OF THE DRAWINGS

These and other features, objects and advantages of embodiments of the invention may be better understood and readily apparent to one of ordinary skill in the art from the following description of a non-limitative, exemplary embodiment, in conjunction with the drawings, in which.

DETAILED DESCRIPTION

Figure 1A:
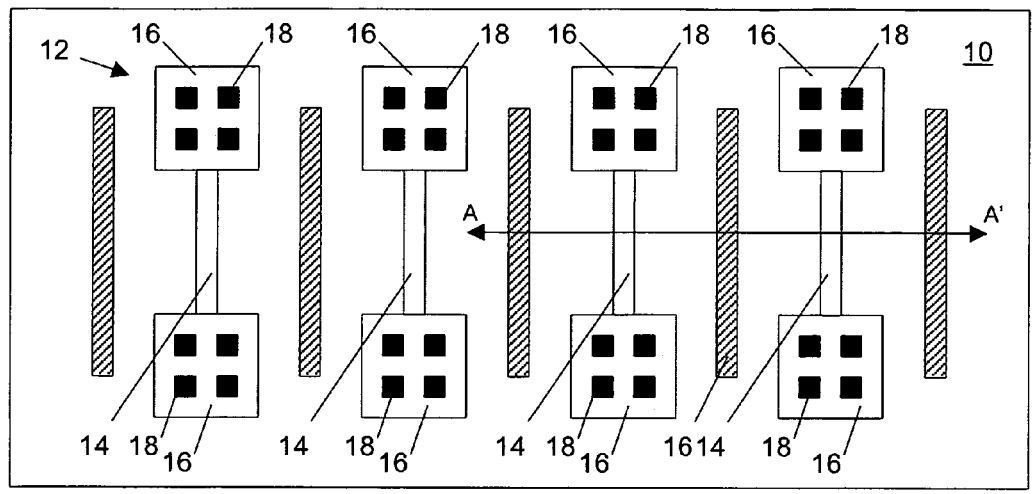
FIG. 1A shows a cross sectional view along a horizontal plan of a semiconductor device in accordance with an embodiment of the invention.
Figure 1B:
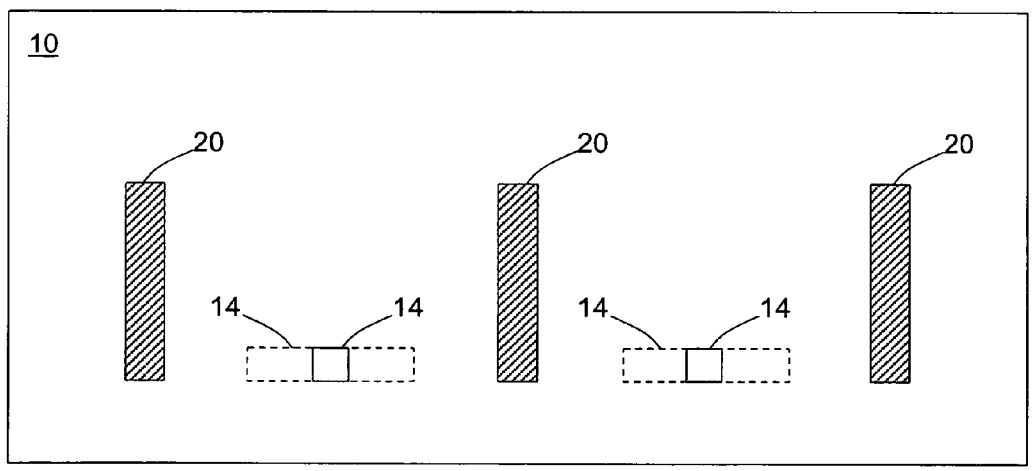
FIG. 1B shows a vertical plan cross sectional view taken along line A–A' of FIG. 1A.

FIG. 1A is a schematic top plan view of a portion of a semiconductor device 10, with a metal interconnection layer 12 of an integrated circuit within the semiconductor device 10. FIG. 1B is a schematic cross sectional view of the semiconductor device 10 along a selected vertical plan A–A' shown in FIG. 1A.

The metal interconnection layer 12 has a number of metal laser fuses 14, each of which is a narrow portion of metal, which extends between two landing pads 16. Vias 18, on the lading pads 16 connect the fuses to other parts of the semiconductor device 10. The metal interconnection layer 12 is a buried layer, typically buried below at least one upper metal layer, below the surface of the semiconductor device 10. However, no metal in any upper layers extends immediately above any of the fuses 14. Shield walls 20, in this embodiment of tungsten, extend parallel to and between the fuses 14 to prevent cracks from propagating to neighbouring metal fuses during laser fuse blowing.

For accurate laser fuse blowing, the thickness of the intermetal dielectrics on top of the metal fuse needs to be well controlled, to limit the interference and phase diffractions between the laser light and the dielectric layers. In general, for optimum laser fuse blowing, a thickness of about 4000–12000 Å ($4–12\times10^{-7}$ m) is specified.

Figure 2:
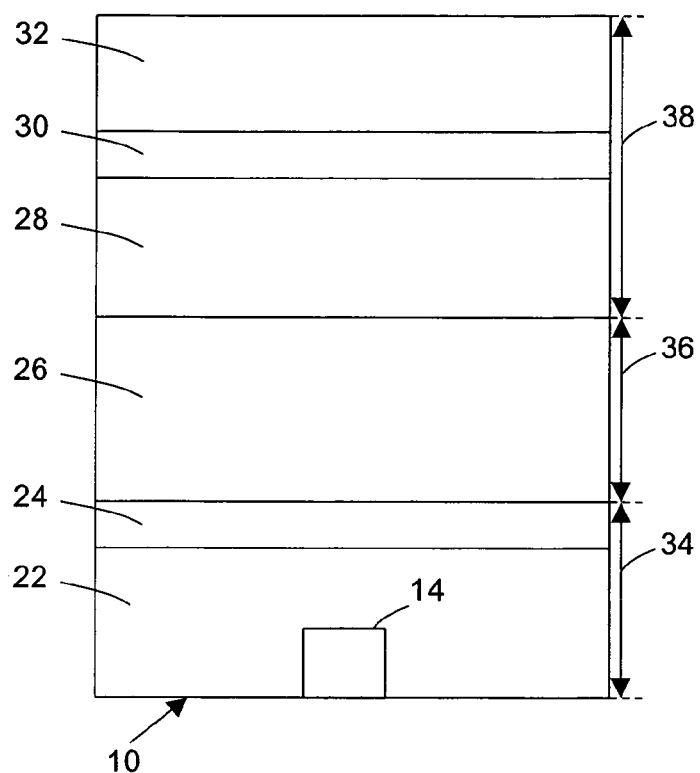
FIG. 2 is a schematic diagram of layers of a semiconductor device with indications of depth of control etching in accordance with an embodiment of the invention.

A sample scheme of the dielectrics above the metal fuse 14 is shown in FIG. 2. In FIG. 2 a semiconductor device 10 includes a metal fuse 14 embedded in a flourinated-silicate-glass (FSG) layer 22, of approximately 6500 Å ($6.5\times10^{-7}$ m) depth above the fuse 14 ($\pm1500$ Å [$1.5\times10^{-7}$ m]). The fuse 14 itself is typically 4000–5000 Å ($4–5\times10^{-7}$ m) deep. On the FSG layer 22 is a Tetraethoxysilane (TEOS) layer 24, of approximately 2000 Å ($2\times10^{-7}$ m) deep ($\pm200$ Å [$0.2\times10^{-7}$ M]). On the TEOS layer 24 is an oxide layer 26 of approximately 16000 Å ($1.6\times10^{-6}$ m) deep ($\pm4000$ Å [$4\times10^{-7}$ m]). On the oxide layer 26 is a High-density-plasma (HDP) oxide layer 28 of approximately 10000 Å ($1\times10^{-6}$ m) deep ($\pm3000$ Å [$3\times10^{-7}$ m]). On the HDP oxide layer 28 is a silicon rich oxide (SRO) layer 30 in the range of 1400 Å–1600 Å ($1.4–1.6\times10^{-7}$ m) deep, for example approximately 1500 Å ($1.5\times10^{-7}$ m) deep. On the silicon rich oxide layer 30 is a plasma-enhanced (PE) nitride layer 32 of approximately 6000 Å ($6\times10^{-7}$ m) deep ($\pm600$ Å [$0.6\times10^{-7}$ m]). A passivation stack 38 is formed by the PE nitride layer 32, the silicon rich oxide layer 30, and the HDP oxide layer 28. An intermetal-dielectric (IMD5) stack 36 is formed by the oxide layer 26. An IMD4 stack 34 is formed by the TEOS layer 24 and the FSG layer 22.

Thus the nominal total depth of the various dielectric layers from the surface of the semiconductor device 10 to the top of the fuse 14 is 42000 Å ($4.2\times10^{-6}$ m), but with possible variations of ($\pm9400$ Å [$9.4\times10^{-7}$ m]). The overall thickness range, which results from process variations in the thicknesses of the overlying layers, leads to a large variation in the final total thickness of dielectric above the metal fuse.

Even the minimum thickness for the various dielectric layers above the fuse far exceeds the thickness of 4000–12000 Å ($4–12\times10^{-7}$ m), desired for laser fuse blowing. Thus a laser fuse window is opened through the passivating nitride and oxide layers, down to at least the oxide layer 26, until a thickness within the optimum thickness range is achieved. This may be done using the typical wafer fabrication process of spinning on resist photolithography to open the window, and then plasma etching to the required thickness. The remaining photo resist is then stripped away using plasma ashing.

However, the question is how to make sure that the correct optimum thickness range is achieved. To achieve accurate readings of material thickness, an ellipsometry tool is normally used. However an ellipsometry tool only provides accurate measurements when the dielectric material is of a constant refractive index. The semiconductor device of FIG. 2 has layers, in particular the passivation and oxide layers, with different refractive indexes. Thus an ellipsometry tool is unable to provide an accurate measurement of the thickness of the semiconductor device 10 down to the fuse 14.

Figure 3:
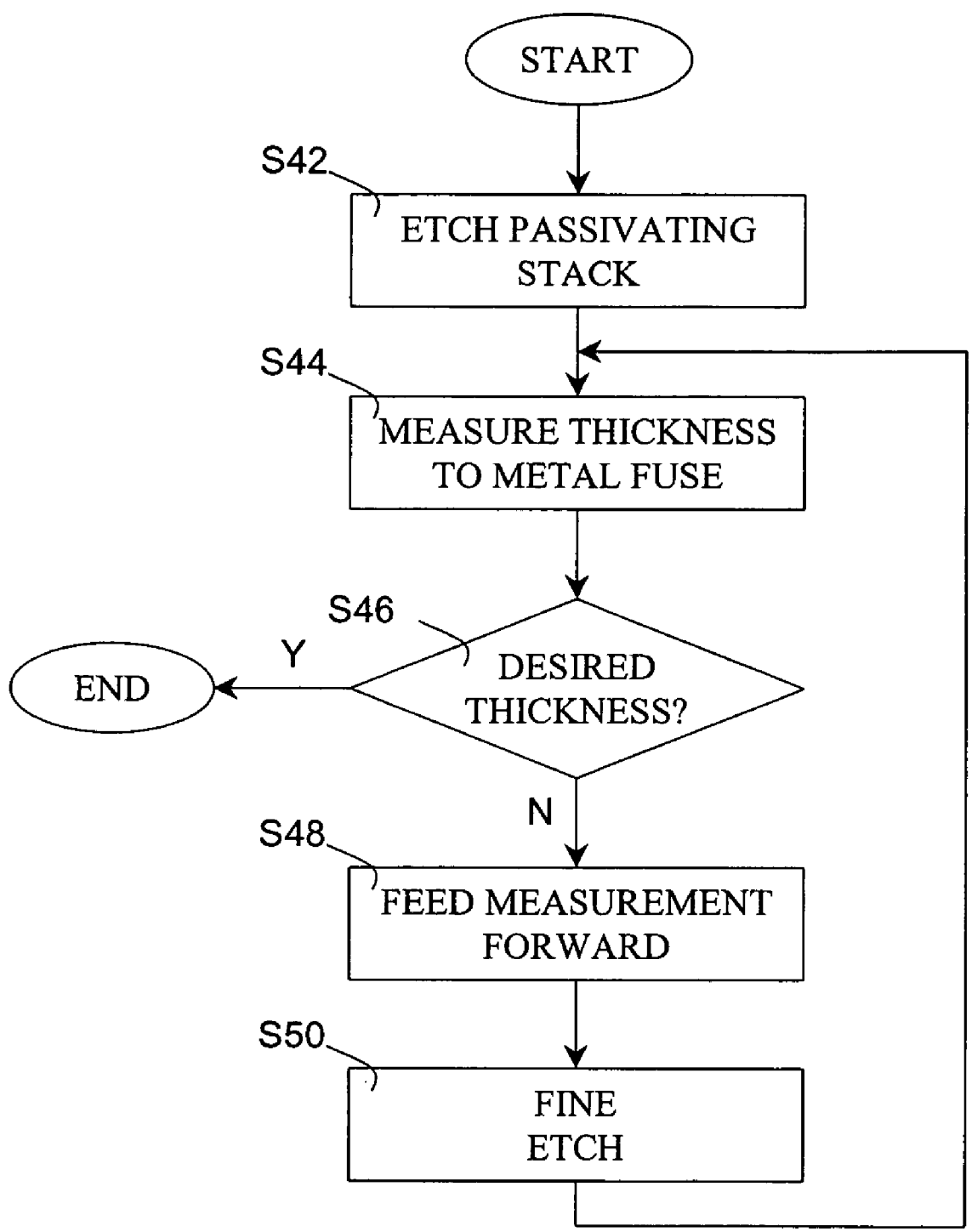
FIG. 3 is a flow chart of a method of an embodiment of the invention.

FIG. 3 is a flowchart relating to the process for opening the laser fuse window. Initially, no measurement is taken, as the ellipsometry tool in such circumstances would yield an inaccurate result. Instead, given that the window must be at least as far down as the IMD5 stack 36 (that is the oxide layer 26), a first step S42 involves etching away at least a first set of material. This involves etching away most of the passivation stack 38, including the nitride layer 32. Whether it is the whole of the passivation stack 38 and what the thickness, d will be that will remain above the fuse after this first etch cannot be determined accurately, as the depths of the various layers is not known to sufficient accuracy. With the nitride layer 32 at least of the passivation stack no longer in the way, it is now possible to use an ellipsometry tool to measure, in step S44, the thickness of the remaining layers, d, above the top surface of the metal fuse. A determination is then made at step S46 as to whether the thickness falls within the desired range, that is 4000–12000 Å ($4–12\times10^{-7}$ m). If the thickness falls within the desired range, as determined in step S46 (YES), then the process ends. If the region above the fuse is too thick, as determined in step S46 (NO), then the thickness measurement is fed forward to the etching equipment, in step S48, which then performs a second, fine tune etch, in step S50, to remove an amount of a second set of material, that is any remaining layer of the passivation stack 38 and/or some of the oxide layer 26. The process then reverts to step S44 to take a further measurement of the thickness of the remaining layers above the top surface of the metal fuse. In this manner the second, fine tune etching is performed repeatedly, until the desired depth range is reached.

As this process does not bother with pre-measurement, the fact that an ellipsometry tool is unable to provide an accurate measurement with a combination of passivation and oxide layers does not matter. The measurement step S44 has no problem with measuring the thickness of the dielectric above the metal fuse once the nitride layer has been removed. Additionally, the final thickness is easily controlled, as the fine etching removes relatively less material of the oxide layer, which allows more accurate achievable margins. Also, the etch time of the fine etching may be tuned easily by using an automated factory floor manufacturing system.

Figure 4:
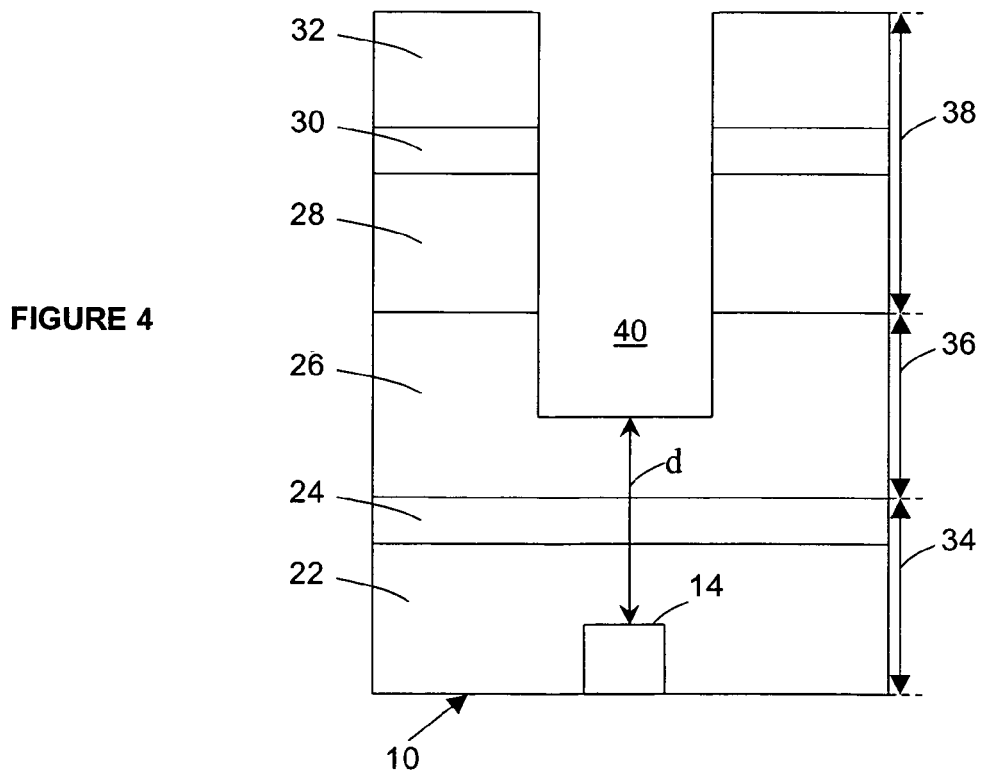
FIG. 4 is a view similar to FIG. 2, but after etching.

FIG. 4 is the same view as FIG. 2, but after the etching process described above with reference to FIG. 3. It shows a window 40, etched into a first region of the semiconductor device, through a first set of material, in the form of the nitride layer 32 and into a second set of material, including the rest of the passivation stack 38 and into the IMD5 stack (where the second set of material also includes the IMD4 stack). The distance between the bottom of the window and the top of the fuse metal 14 is d.

FIGS. 5A to 5F are trend charts and Statistical Process Control (SPC) charts of the pre-fine etching thickness measurements and post-fine etching thickness measurements. The charts show that the final thickness is well controlled even though the pre-fine etching thickness varies widely. This is due largely to the feedforward system fine tuning.

Figure 5A:
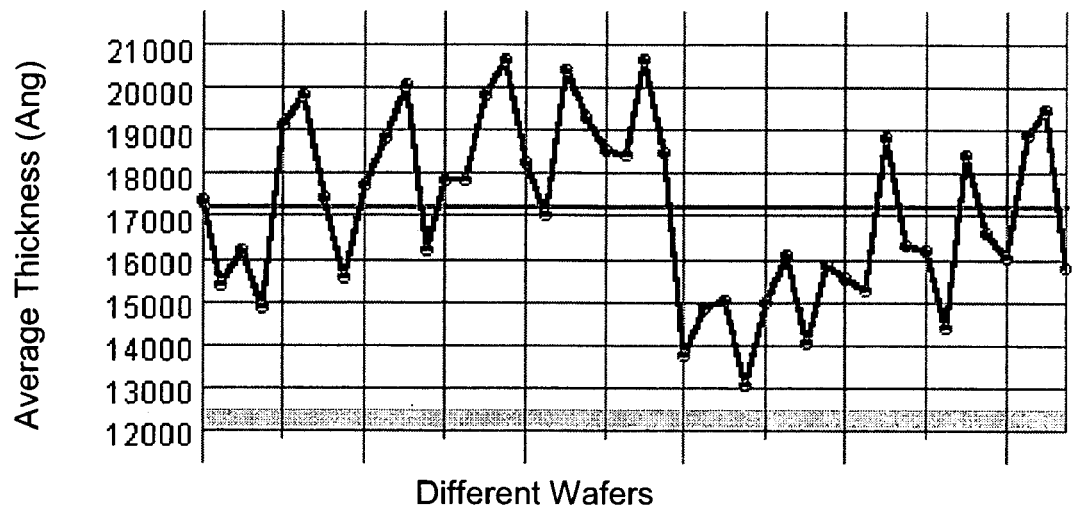
FIGS. 5A–5F are graphs comparing pre-fine etching thickness and post-fine etching thickness trends of a method in accordance with an embodiment of the invention.
Figure 5B:
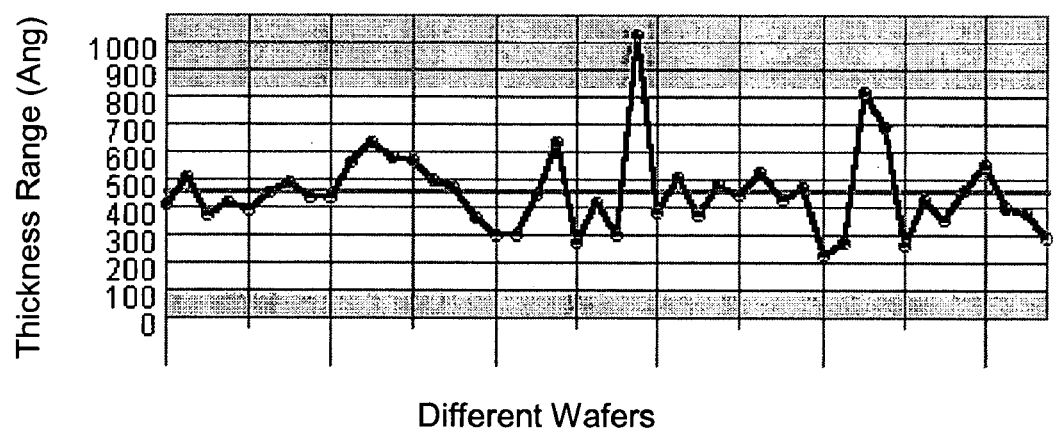
Figure 5C:
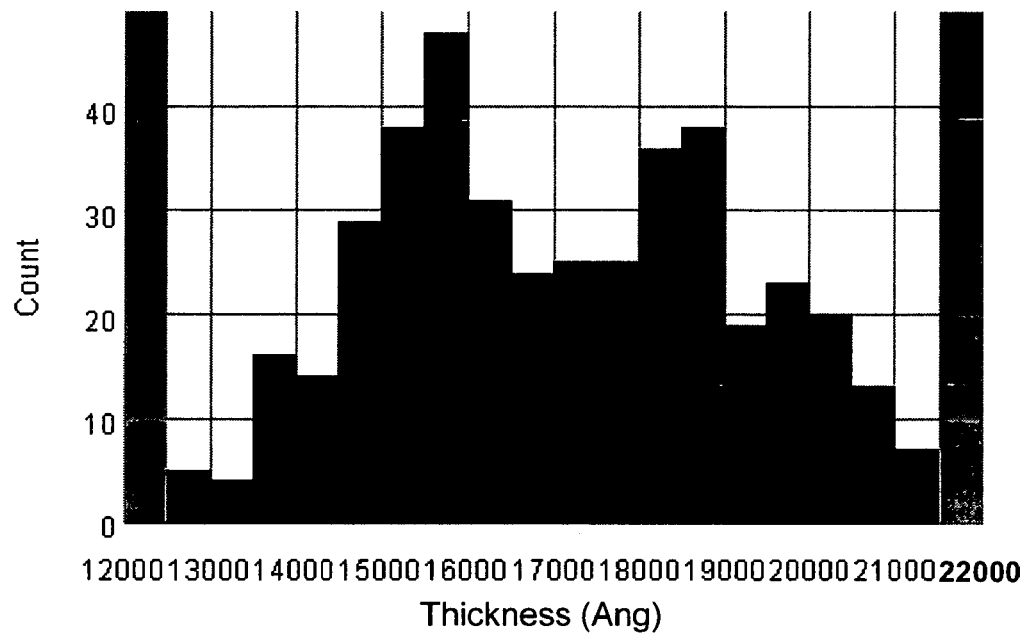

FIGS. 5A and 5B are Statistical Process Control (SPC) charts of the thickness of the dielectric above the metal fuse measured at step S44 in the process of FIG. 3, when only the passivation stack has been removed. FIG. 5A is a mean chart and FIG. 5B is a range chart. Each point in FIG. 5A represents the mean remaining depth across a number of windows (e.g. 9) on a single wafer, with the x-axis representing wafers from different batches. Ideally, these means would all be the same. For each wafer the range was taken between the maximum remaining depth and the minimum remaining depth, to provide the results in FIG. 5B. Ideally, the range would be 0 in each case. FIG. 5C is a histogram showing the distribution of these thicknesses. As can be seen from these three charts, the variation in the thicknesses measured at step S44 in the process of FIG. 3, when only the passivation stack has been removed is very large (about 12000~22000 Å [1.2–2.2×10$^{-6}$ m]). It is also observed that the thicknesses do not provide a standard bell-shaped normal distribution curve. The main reason for this is due to variations in the deposition of the dielectrics and the initial etch step S42 itself.

Figure 5D:
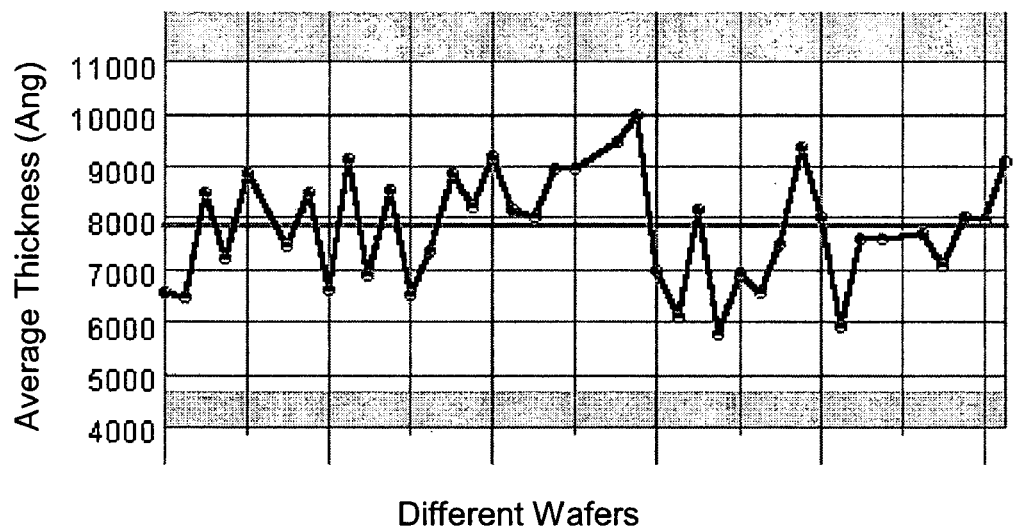
Figure 5E:
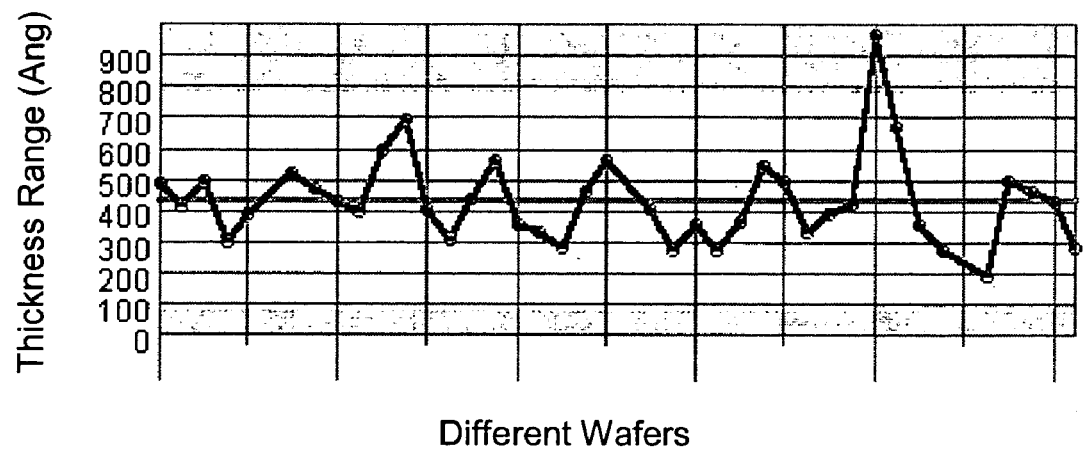
Figure 5F:
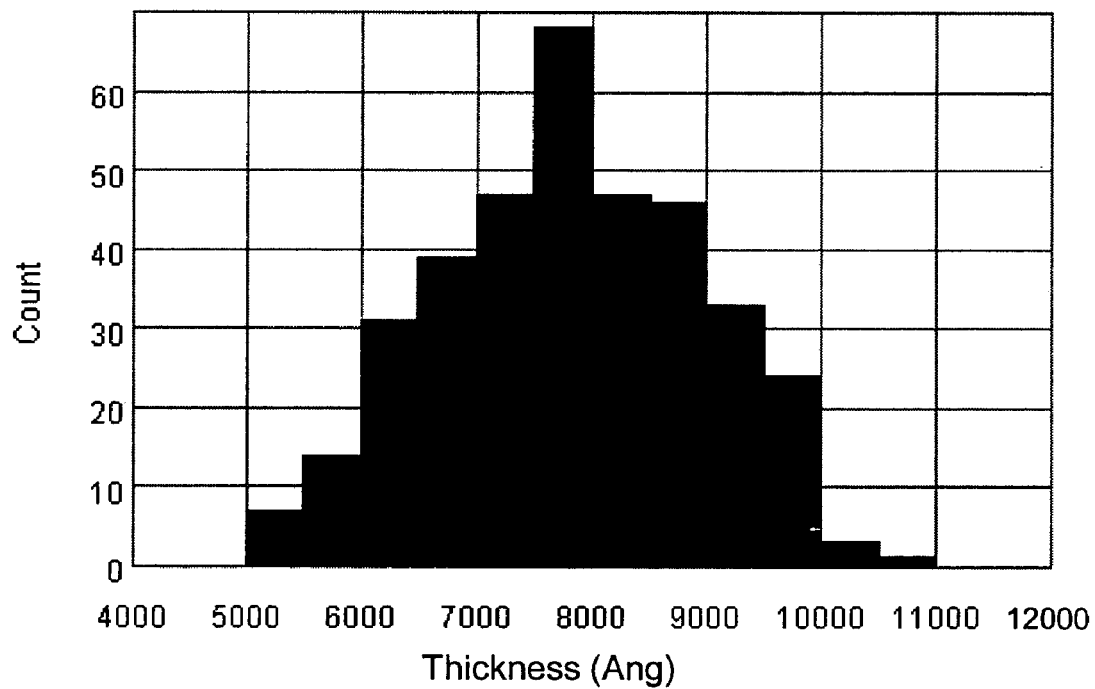

FIGS. 5D and 5E are SPC charts of the final thicknesses of the dielectric above the metal fuse measured at step S44 in the process of FIG. 3. FIG. 5D is the mean chart and FIG. 5E is the range chart. FIG. 5F is a histogram showing the distribution of the final thicknesses above the metal fuse. As can be seen, the final thickness is well controlled with the specifications of 4000~12000 Å (4–12×10$^{-7}$ m). It can also be seen that the distribution is well distributed around the mean of 8000 Å (8×10$^{-7}$ m).

The invention claimed is:

1. A method of etching a semiconductor device having a fuse embedded therein beneath different first and second sets of material, comprising:
   (a) first etching at least a first set of material from a first region of the semiconductor device, from the surface of the first set of material in towards the embedded fuse;
   (b) measuring the remaining distance between the embedded fuse and the first etched surface of the first region of the semiconductor device;
   (c) second etching an amount of the second set of material from said first region of the semiconductor device, from the first etched surface of the first region further in towards the embedded fuse, the amount of the second set of material being determined based on the preceding measurement of the remaining distance;
   (d) measuring the remaining distance between the embedded fuse and the second etched surface of the first region of the semiconductor device; and
   (e) determining if the remaining distance measured in step (d) falls within a desired range of distances and, if the remaining distance does not fall within the desired range, returning to step (c).

2. The method of claim 1, wherein the first etching further etches at least an amount of the second set of material.

3. The method of claim 1, wherein one of the first and second sets of material comprises at least a passivating layer and the other of the first and second sets of material comprises at least one oxide layer.

4. The method of claim 3, wherein the first set of material comprises the passivating layer.

5. The method of claim 3, wherein the other of the first and second set of material comprising at least one oxide layer further comprises at least a second oxide layer.

6. The method of claim 3, wherein the other of the first and second sets of material comprising at least one oxide layer has uniform diffraction characteristics.

7. The method of claim 3, wherein the passivating layer comprises a nitride layer.

8. The method of claim 1, wherein the desired range of distances is 4000–12000 Å (4–12 ×10$^{-7}$ m).

9. The method of claim 1, wherein the fuse is a metal fuse.

10. The method of claim 1, wherein the fuse is a laser fuse.

11. The method of claim 1, further comprising blowing said fuse.

12. A semiconductor device having a metal fuse embedded therein, modified by the method according to claim 1.

13. A method of etching a semiconductor device having a fuse embedded therein beneath different first and second sets of material, comprising:
   (a) first etching at least a first set of material from a first region of the semiconductor device, from the surface of the first set of material in towards the embedded fuse;
   (b) measuring the remaining distance between the embedded fuse and the first etched surface of the first region of the semiconductor device;
   (c) second etching an amount of the second set of material from said first region of the semiconductor device, from the first etched surface of the first region further in towards the embedded fuse, the amount of the second set of material being determined based on the preceding measurement of the remaining distance;
   (d) measuring the remaining distance between the embedded fuse and the second etched surface of the first region of the semiconductor device;
   (e) determining if the remaining distance measured in step (d) falls within a desired range of distances and, if the remaining distance does not fall within the desired range, returning to step (c);
   wherein one of the first and second sets of material comprises at least a passivating layer and the other of the first and second sets of material comprises at least one oxide layer; and
   wherein the other of the first and second sets of material comprising at least one oxide layer has uniform diffraction characteristics.

14. A method of etching a semiconductor device having a fuse embedded therein beneath different first and second sets of material, comprising:
   (a) first etching at least a first set of material from a first region of the semiconductor device, from the surface of the first set of material in towards the embedded fuse;
   (b) measuring the remaining distance between the embedded fuse and the first etched surface of the first region of the semiconductor device;
   (c) second etching an amount of the second set of material from said first region of the semiconductor device, from the first etched surface of the first region further in towards the embedded fuse, the amount of the second set of material being determined based on the preceding measurement of the remaining distance;
   (d) measuring the remaining distance between the embedded fuse and the second etched surface of the first region of the semiconductor device;
   (e) determining if the remaining distance measured in step (d) falls within a desired range of distances and, if the remaining distance does not fall within the desired range, returning to step (c);
   wherein one of the first and second sets of material comprises at least a passivating layer and the other of the first and second sets of material comprises at least one oxide layer;
   wherein the other of the first and second sets of material comprising at least one oxide layer has uniform diffraction characteristics; and
   wherein the passivating layer comprises a nitride layer.

* * * * *